(12) United States Patent
Kim

(10) Patent No.: US 7,033,907 B2
(45) Date of Patent: Apr. 25, 2006

(54) METHOD FOR FORMING ISOLATION LAYER OF SEMICONDUCTOR DEVICE

(75) Inventor: Jung Geun Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 123 days.

(21) Appl. No.: 10/878,451

(22) Filed: Jun. 28, 2004

(65) Prior Publication Data

US 2005/0118784 A1    Jun. 2, 2005

(30) Foreign Application Priority Data

Nov. 28, 2003    (KR) ...................... 10-2003-0085795

(51) Int. Cl.
*H01L 21/302* (2006.01)

(52) U.S. Cl. ...................... 438/425; 438/427; 438/429; 438/435

(58) Field of Classification Search ...................... None
See application file for complete search history.

(56) References Cited

U.S. PATENT DOCUMENTS

| 6,258,692 B1 * | 7/2001 | Chu et al. | 438/400 |
| 6,486,039 B1 * | 11/2002 | Yoo et al. | 438/425 |
| 6,607,959 B1 * | 8/2003 | Lee et al. | 438/296 |

* cited by examiner

*Primary Examiner*—Luan Thai
(74) *Attorney, Agent, or Firm*—Ladas & Parry LLP

(57) ABSTRACT

A method for forming an isolation layer of a semiconductor device is disclosed, which comprises the steps of: etching a silicon substrate having a cell region and a peripheral circuit region, forming a first trench having a first size in the cell region, and forming a second trench having a second size, which is larger than the first size of the first trench, in the peripheral circuit region; forming a sidewall oxide layer on surfaces of the first trench and the second trench; sequentially depositing a liner nitride layer and a liner oxide layer on a resultant substrate inclusive of the sidewall oxide layer; performing a plasma pre-heating process using $O_2$+He with respect to the resultant substrate in an HDP CVD process chamber and selectively oxidizing a portion of the liner nitride layer remaining on a bottom of the second trench in the peripheral circuit region; continuously depositing an HDP oxide layer on the resultant substrate having been subjected to the plasma pre-heating process, thereby filling the trenches; and performing a chemical mechanical polishing process with respect to the HDP oxide layer.

6 Claims, 5 Drawing Sheets sell region      peripheral circuit region sell region      peripheral circuit region sell region          peripheral circuit region

METHOD FOR FORMING ISOLATION LAYER OF SEMICONDUCTOR DEVICE

BACKGROUND OF THE INVENTION

1. Field of the Invention

The present invention relates to a method for forming an isolation layer of a semiconductor device, and more particularly to a method for preventing the deterioration of a leakage characteristic due to the formation of a liner nitride layer in a peripheral circuit region.

2. Description of the Prior Art

In order to increase data retention time, which is retention time of data stored in a DRAM cell, that is, **to improve refresh characteristic, technology has been introduced, which forms a liner nitride layer before the deposition of an oxide layer buried in a trench in a shallow trench isolation (hereinafter, referred to as an STI) process.

Herein, the improvement in the refresh characteristic is resulted from stress alleviation and diffusion prevention on an isolation layer by the liner nitride layer.

Further, the formation of the liner nitride layer may be preferred in a cell region, but it causes a leakage in an off state, which is called hot electron induced punchthrough (HEIP), in a P+ well region of a peripheral circuit region. Such a phenomenon is disclosed in a document entitled "Ref. S. J. Ahn, et. al., IEEE $40^{th}$ annual international reliability physics sympo, 2002, p 365–368".

According to that document, the hot electron induced punchthrough frequently occurs in a transistor to which a high voltage is applied. Especially, since a pMOS uses a buried channel, the hot electron induced punchthrough more frequently occurs in a PMOS than an nMOS.

FIG. 1 is a sectional view illustrating a leakage characteristic due to the formation of a liner nitride layer on a cell region and a peripheral circuit region according to the prior art.

As shown in FIG. 1, since an N⁻ well 2a is formed in the cell region, electron trapping due to the liner nitride layer 5 does not occur. Accordingly, the deterioration of a leakage characteristic due to the formation of the liner nitride layer 5 does not occur.

In contrast, the electron trapping due to the liner nitride layer 5 occurs in a P+ well region 2b in the peripheral circuit region, so that attractive force acts on holes on an interface between substrate active silicon and a sidewall oxide layer 4 and an interface between the sidewall oxide layer 4 and the liner nitride layer 5. Therefore, a leakage characteristic deteriorates.

As described above, the liner nitride layer is formed to improve refresh characteristic in a DRAM device and actually improves the refresh characteristic in the cell region, thereby improving the properties of a device. However, the liner nitride layer deteriorates the leakage characteristic in the P+ well region of the peripheral circuit region. Accordingly, it is necessary to prevent the leakage characteristic from deteriorating in the peripheral circuit region.

SUMMARY OF THE INVENTION

Accordingly, the present invention has been made to solve the above-mentioned problems occurring in the prior art, and it is an object of the present invention to provide a method for forming isolation layer of a semiconductor device, which can prevent the deterioration of a leakage characteristic due to a liner nitride layer in a peripheral circuit region.

Another object of the present invention is to provide a method for forming isolation layer of a semiconductor device, which improves the refresh characteristic and prevents the deterioration of the leakage characteristic in a peripheral circuit region, thereby improving the reliability and properties of a device.

In order to achieve the above objects, according to one aspect of the present invention, there is provided a method for forming an isolation layer of a semiconductor device comprising the steps of: etching a silicon substrate having a cell region and a peripheral circuit region, forming a first trench having a first size in the cell region, and forming a second trench having a second size, which is larger than the first size of the first trench, in the peripheral circuit region; forming a sidewall oxide layer on surfaces of the first trench and the second trench; sequentially depositing a liner nitride layer and a liner oxide layer on a resultant substrate inclusive of the sidewall oxide layer; performing a plasma pre-heating process using $O_2$+He with respect to the resultant substrate in an HDP CVD process chamber and selectively oxidizing a portion of the liner nitride layer remaining on a bottom of the second trench in the peripheral circuit region; continuously depositing an HDP oxide layer on the resultant substrate having been subjected to the plasma pre-heating process, thereby filling the trenches; and performing a chemical mechanical polishing process with respect to the HDP oxide layer.

In the present invention, the sidewall oxide layer is grown to have a thickness of 75 to 85 Å, the liner nitride layer is deposited to have a thickness of 45 to 55 Å, and the liner oxide layer is deposited to have a thickness of 20 to 60 Å.

In the present invention, the plasma pre-heating process step using $O_2$+He is carried out for 100 to 200 seconds under conditions in which bias power is 3 to 5 kW, and $O_2$ gas and $H_2$ gas flow by as much as 50 to 200 sccm respectively.

In the aforementioned method of the present invention, a liner oxide layer deposition step can be omitted. Herein, the liner nitride layer is deposited to have a thickness of 60 to 100 Å.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Hereinafter, a technical principle of the present invention will be described.

A liner nitride layer is formed to improve refresh characteristic, and it is preferred to form the liner nitride layer in a cell region. However, since the liner nitride layer deteriorates a leakage characteristic in a peripheral circuit region, it is not preferred to form the liner nitride layer in the peripheral circuit region. Accordingly, in the present invention, the liner nitride layer is formed in the cell region and the peripheral circuit region and only a portion of the liner nitride layer formed on the bottom portion of a trench in the peripheral circuit region is selectively eliminated. In this way, a P+ leakage path is eliminated, so that the deterioration of the leakage characteristic in the peripheral circuit region does not occur.

By this reason, in the present invention, the liner nitride layer can be made to remain on both a sidewall and a bottom of a trench in a cell region without an additional process and can be made to remain only on a side wall of a trench in peripheral circuit region, by only partially changing the process conditions in depositing an HDP-oxide layer used as an insulation layer buried in a trench.

FIGS. 2a to 2d are sectional views according to steps in a method for forming an isolation layer of a semiconductor device according to one embodiment of the present invention. Hereinafter, the isolation layer formation method will be described in more detail with reference to FIGS. 2a to 2d.

Figure 1:
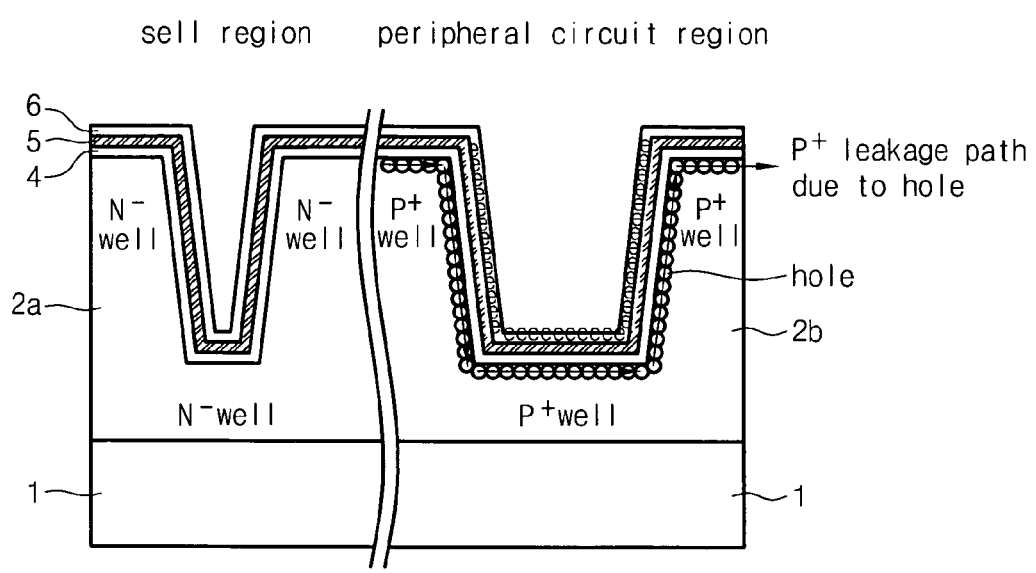
FIG. 1 is a sectional view illustrating a leakage characteristic due to the formation of a liner nitride layer on a cell region and a peripheral circuit region according to the prior art.
Figure 2A:
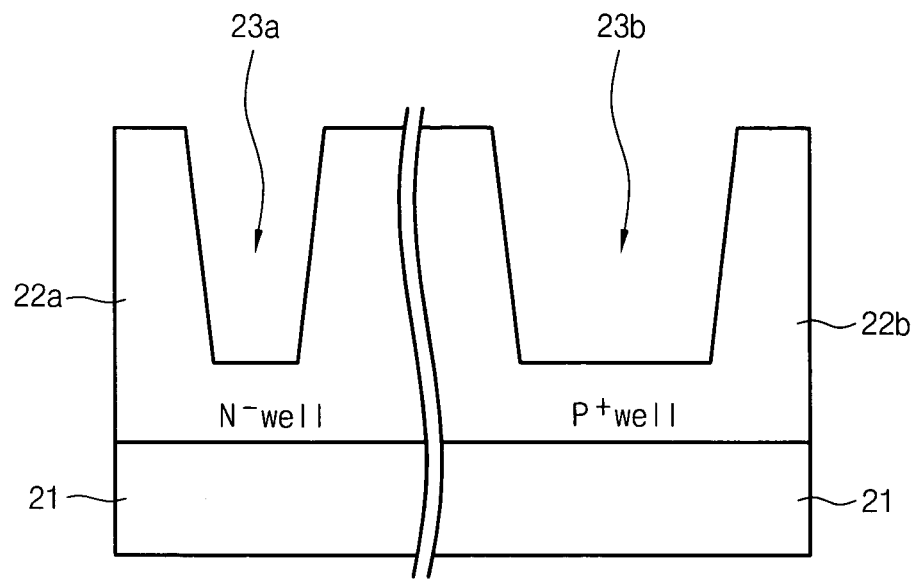
FIGS. 2a to 2d are sectional views according to steps in a method for forming an isolation layer of a semiconductor device according to an embodiment of the present invention.

Referring to FIG. 2a, a silicon substrate 21 is prepared. The silicon substrate 21 includes a cell region and a peripheral circuit region, and a well ion implantation process is carried out to form an N− well 22a in the cell region and to form a P+ well 22b in the peripheral circuit region.

Next, a pad oxide layer and a pad nitride layer are sequentially formed on the silicon substrate 21, and the pad nitride layer is subjected to patterning. Then, a series of STI process, through which the pad oxide layer and the silicon substrate 21 are etched using the patterned pad nitride layer as an etching mask, is carried out to form a first trench 23a having a first size in the cell region of the silicon substrate 21 and to form a second trench 23b having a second size, which is relatively larger than the first size of the first trench 23a, in the peripheral circuit region.

Figure 2B:
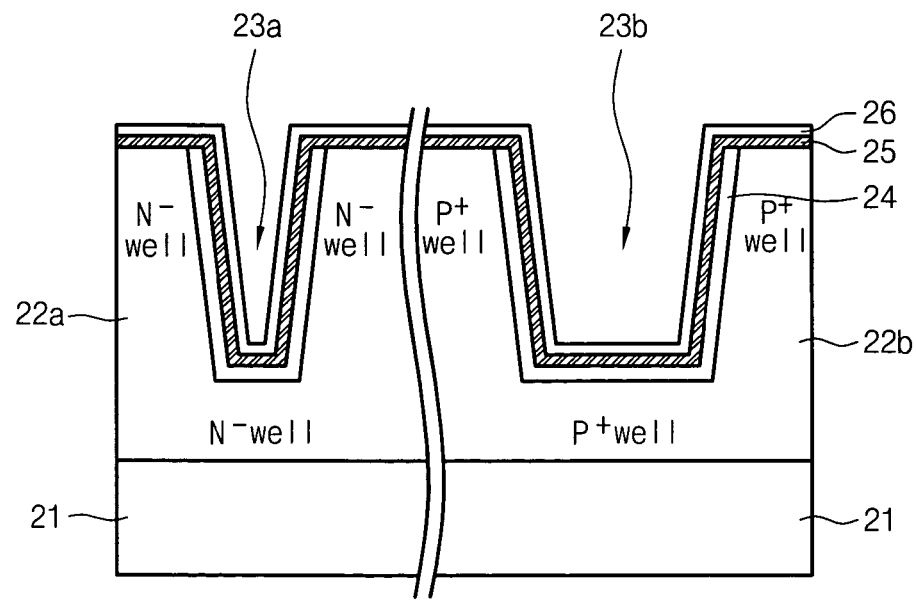

Referring to FIG. 2b, the resultant substrate is sequentially subjected to a sacrificial oxide layer process, a cleaning process, and a wall oxidation process, thereby growing a sidewall oxide layer 24 on the surfaces of the trenches 23a and 23b. Herein, the sidewall oxide layer 24 is grown to have a thickness of 75 to 85 Å thicker than 60 Å, a thickness in the prior art, and preferably the sidewall oxide layer 24 is grown to have a thickness of 80 Å.

Next, a liner nitride layer 25 is deposited to have a thickness of 45 to 55 Å, preferably 50 Å, on the resultant substrate inclusive of the sidewall oxide layer 24. Subsequently, a liner oxide layer 26 is deposited to have a thickness of 20 to 60 Å thinner than 80 Å, a thickness in the prior art, on the liner nitride layer 25 and preferably the liner oxide layer 26 is deposited to have a thickness of 60 Å.

Herein, decreasing the thickness of the liner oxide layer 26 in comparison with the prior art is for increasing the degree of oxidation of the liner nitride layer, which has been formed on a bottom of the second trench 23b in the peripheral circuit region, in the following oxidation process. This will be described later.

Figure 2C:
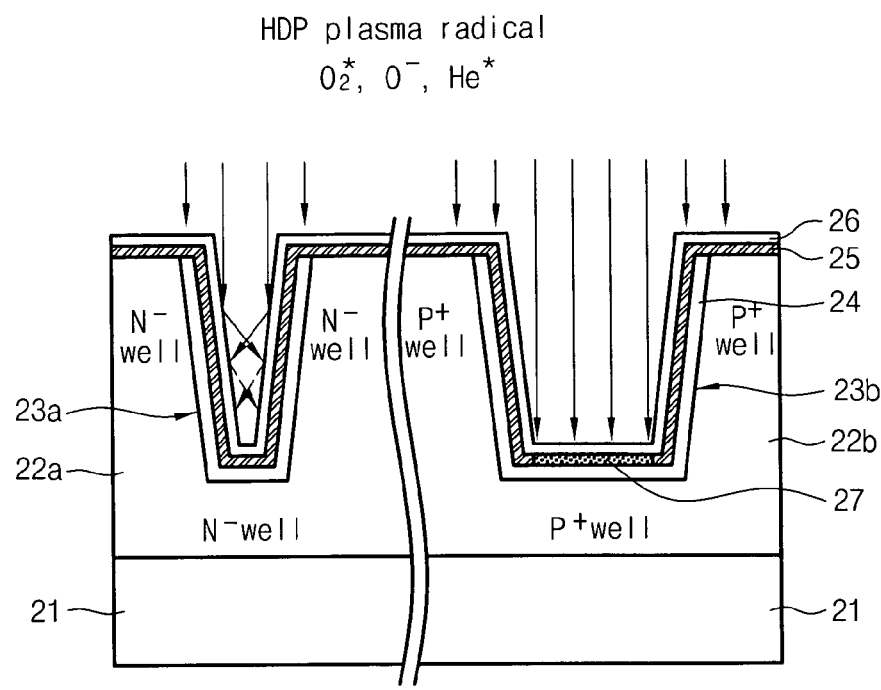

Referring to FIG. 2c, a high-density plasma chemical vapor deposition (hereinafter, referred to as an HDP CVD) process is carried out to deposit an HDP oxide layer on the liner oxide layer 26. That is, the resultant substrate is subjected to a plasma pre-heating process using O₂+He for about 100 to 200 seconds, preferably, 150 seconds. In the plasma pre-heating process, bias power is 3 to 5 kW, and O₂ gas and H₂ gas flow by as much as 50 to 200 sccm respectively.

During the plasma pre-heating process, a portion of the liner nitride layer formed on the bottom portion of the second trench 23b in the peripheral circuit region is selectively oxidized by the reaction as shown in the following expression. Therefore, a liner oxynitride layer 27 is formed.

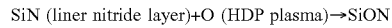

SiN (liner nitride layer)+O (HDP plasma)→SiON

Herein, the reasons that the portion of the liner nitride layer formed on the bottom portion of the second trench 23b in the peripheral circuit region is selectively oxidized are as follows. Firstly, collision angles of HDP ions are small in sidewalls of the first trench 23a and the second trench 23b and thus energy necessary for reaction, that is, driving force is small, so that oxidation is not performed in the sidewalls of the first trench 23a and the second trench 23b. Secondly, HDP ions are interfered with by ambient active atmosphere to lose impulse energy in the bottom, having a narrow trench width, of the first trench 23a in the cell region and thus energy necessary for reaction is small, so that oxidation is not performed even in the bottom of the first trench 23a. Thirdly, since the bottom of the second trench 23b in the peripheral circuit region has a trench width relatively wider than that in the cell region, most HDP ions reach the bottom of the second trench 23b. Therefore, oxidation is not performed only in the bottom of the second trench 23b.

As described above, the liner oxide layer 26 has a deposition thickness thinner than that in the prior art, so that the degree of oxidation of the liner nitride layer can be increased in the plasma pre-heating process.

In the aforementioned embodiment, in order to increase the degree of oxidation of the liner nitride layer in the plasma pre-heating process, the thickness of the liner oxide layer 26 is reduced. However, in another embodiment of the present invention, a liner oxide layer deposition step is omitted, thereby increasing the degree of oxidation of a liner nitride layer in a plasma pre-heating process. Herein, the liner nitride layer has a deposited thickness of 60 to 100 Å, preferably 60 Å.

Figure 2D:
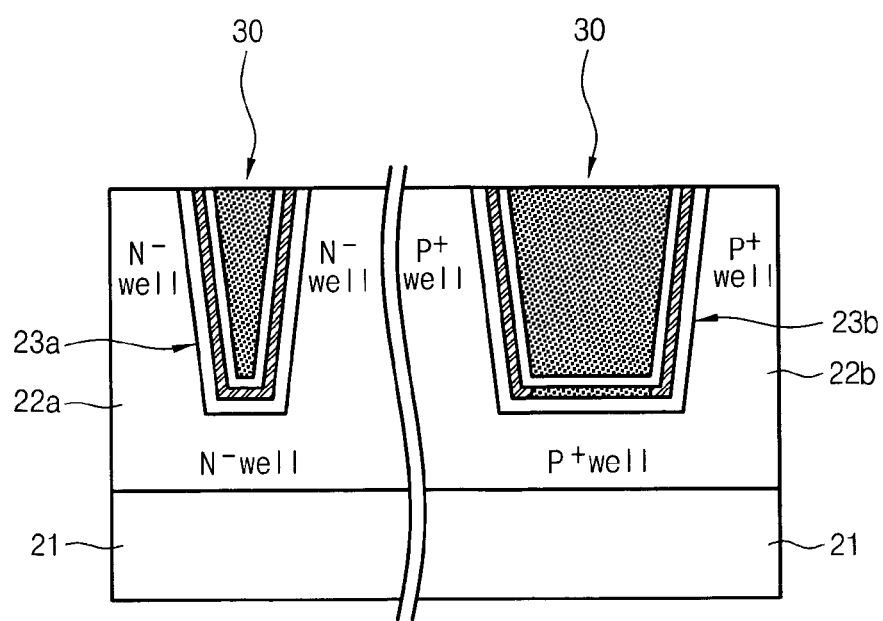

Referring to FIG. 2d, an HDP oxide layer having a thickness of 5000 Å, which can completely fill the trenches, is continuously deposited on the resultant substrate, which has been subjected to a plasma pre-heating process using O₂+He, in an HDP CVD process chamber. Next, the HDP oxide layer is subjected to a chemical mechanical polishing process to expose the pad nitride layer. Then, the pad nitride layer and the pad oxide layer are sequentially eliminated through a wet etching process using phosphoric acid and a cleaning process using hydrofluoric acid, thereby forming trench-type isolation layers 30 in the cell region and the peripheral circuit region on the silicon substrate 21 respectively.

As described above, a method for forming an isolation layer according to the present invention, a liner nitride layer formed on a trench bottom of a peripheral circuit region is selectively oxidized, so that a P+ leakage path can be blocked. Therefore, the deterioration of a leakage characteristic in the peripheral circuit region can be prevented.

Figure 3A:
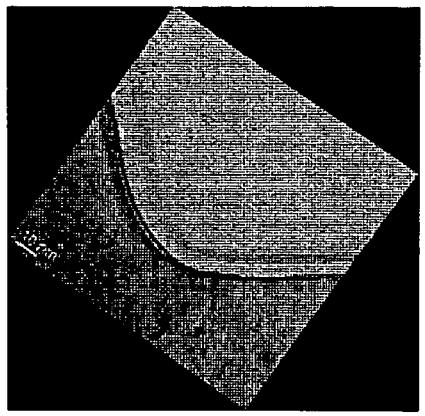
FIGS. 3a to 3c show isolation layers in cell regions and peripheral circuit regions according to the prior art, one embodiment of the present invention, and another embodiment of the present invention, respectively.
Figure 3A:
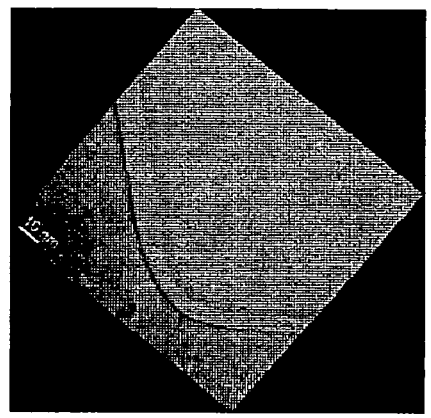
Figure 3B:
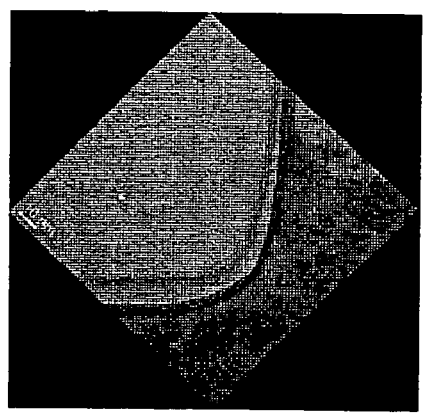
Figure 3B:
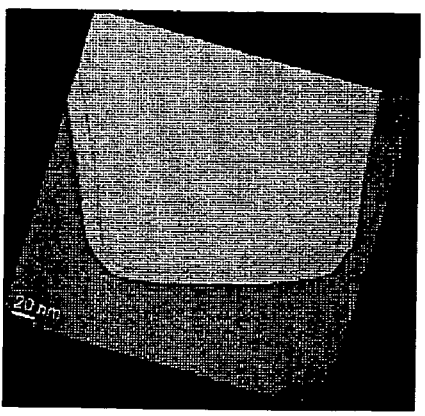
Figure 3C:
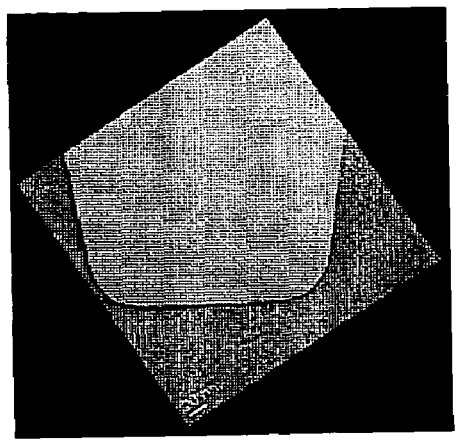
Figure 3C:
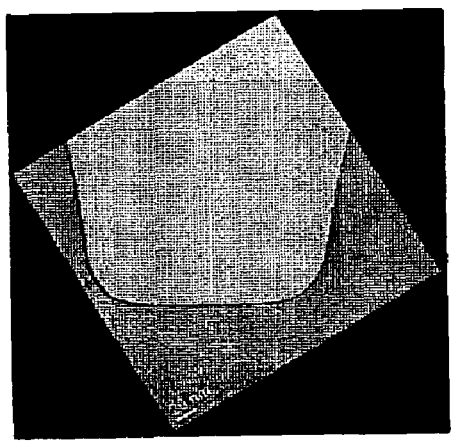

FIGS. 3a to 3c show isolation layers in cell regions and peripheral circuit regions according to the prior art, one embodiment of the present invention, and another embodiment of the present invention, respectively.

Firstly, as shown in FIG. 3a, in the prior art, since a liner nitride layer remains on both a sidewall and a bottom of a trench in a peripheral circuit region, the deterioration of a leakage characteristic in the peripheral circuit region occurs.

In contrast, as shown in FIGS. 3b and 3c, in the present invention in which a plasma pre-heating process has been carried out before an HDP oxide layer is actually deposited, a liner nitride layer remains on the sidewall of a trench in a peripheral circuit region, but the liner nitride layer remaining on the bottom of the trench in the peripheral circuit region is selectively oxidized, so that a $P^+$ leakage path due to the liner nitride layer is blocked. Therefore, the deterioration of the leakage characteristic in the peripheral circuit region does not occur.

Consequently, in the present invention, a plasma pre-heating process is carried out for a determined time period in an initial step of the deposition of an HDP oxide layer, so that a portion of a liner nitride layer remaining on the bottom of a trench in a peripheral circuit region can be selectively oxidized even without an additional process. Therefore, not only refresh characteristic in a cell region can be improved, but also the deterioration of a leakage characteristic in the peripheral circuit region can be prevented.

As described above, according to the present invention, a portion of a liner nitride layer formed on the bottom of a trench in a peripheral circuit region is selectively oxidized through a plasma pre-heating process, thereby improving refresh characteristic in a cell region of a substrate through the formation of a liner nitride layer and preventing the deterioration of a leakage characteristic in the peripheral circuit region. Therefore, the properties and reliability of a device can be improved.

Further, according to the present invention, when a trench is filled up with an HDP oxide layer by oxidizing a liner nitride layer, deposition speed increases. Therefore, not only the total process time can be reduced but also a trench filling progress can be improved.

Furthermore, according to the present invention, when a liner oxide layer deposition step is omitted, the manufacturing process can be simplified. Therefore, costs can be lowered.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A method for forming an isolation layer of a semiconductor device, the method comprising the steps of:
    etching a silicon substrate having a cell region and a peripheral circuit region, forming a first trench having a first size in the cell region, and forming a second trench having a second size, which is larger than the first size of the first trench, in the peripheral circuit region;
    forming a sidewall oxide layer on surfaces of the first trench and the second trench;
    sequentially depositing a liner nitride layer and a liner oxide layer on a resultant substrate inclusive of the sidewall oxide layer;
    performing a plasma pre-heating process using $O_2$+He with respect to the resultant substrate in an HDP CVD process chamber and selectively oxidizing a portion of the liner nitride layer remaining on a bottom of the second trench in the peripheral circuit region;
    continuously depositing an HDP oxide layer on the resultant substrate having been subjected to the plasma pre-heating process, thereby filling the trenches; and
    performing a chemical mechanical polishing process with respect to the HDP oxide layer.

2. The method for forming an isolation layer of a semiconductor device as claimed in claim 1, wherein the sidewall oxide layer is grown to have a thickness of 75 to 85 Å, the liner nitride layer is deposited to have a thickness of 45 to 55 Å, and the liner oxide layer is deposited to have a thickness of 20 to 60 Å.

3. The method for forming an isolation layer of a semiconductor device as claimed in claim 1, wherein the plasma pre-heating process step using $O_2$+He is carried out for 100 to 200 seconds under conditions in which bias power is 3 to 5 kW, and $O_2$ gas and $H_2$ gas flow by as much as 50 to 200 sccm respectively.

4. A method for forming an isolation layer of a semiconductor device, the method comprising the steps of:
    etching a silicon substrate having a cell region and a peripheral circuit region, forming a first trench having a first size in the cell region, and forming a second trench having a second size, which is larger than the first size of the first trench, in the peripheral circuit region;
    forming a sidewall oxide layer on surfaces of the first trench and the second trench;
    depositing a liner nitride layer on a resultant substrate inclusive of the sidewall oxide layer;
    performing a plasma pre-heating process using $O_2$+He with respect to the resultant substrate in an HDP CVD process chamber and selectively oxidizing a portion of the liner nitride layer remaining on a bottom of the second trench in the peripheral circuit region;
    continuously depositing an HDP oxide layer on the resultant substrate having been subjected to the plasma pre-heating process, thereby filling the trenches; and
    performing a chemical mechanical polishing process with respect to the HDP oxide layer.

5. The method for forming an isolation layer of a semiconductor device as claimed in claim 4, wherein the sidewall oxide layer is grown to have a thickness of 75 to 85 Å and the liner nitride layer is deposited to have a thickness of 60 to 100 Å.

6. The method for forming an isolation layer of a semiconductor device as claimed in claim 4, wherein the plasma pre-heating process step using $O_2$+He is carried out for 100 to 200 seconds under conditions in which bias power is 3 to 5 kW, and $O_2$ gas and $H_2$ gas flow by as much as 50 to 200 sccm respectively.

* * * * *